United States Patent
Kozasa et al.

(10) Patent No.: US 9,956,663 B2
(45) Date of Patent: May 1, 2018

(54) METHOD FOR POLISHING SILICON WAFER

(71) Applicant: SUMCO CORPORATION, Tokyo (JP)

(72) Inventors: Kazuaki Kozasa, Tokyo (JP); Katsuhisa Sugimori, Tokyo (JP); Syunya Kobuchi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days. days.

(21) Appl. No.: 15/506,431

(22) PCT Filed: May 13, 2015

(86) PCT No.: PCT/JP2015/063824
§ 371 (c)(1),
(2) Date: Feb. 24, 2017

(87) PCT Pub. No.: WO2016/031310
PCT Pub. Date: Mar. 3, 2016

(65) Prior Publication Data
US 2017/0252891 A1    Sep. 7, 2017

(30) Foreign Application Priority Data
Aug. 29, 2014    (JP) .................................. 2014-175330

(51) Int. Cl.
| | |
|---|---|
| *B24B 37/24* | (2012.01) |
| *B24B 37/10* | (2012.01) |
| *H01L 21/306* | (2006.01) |

(52) U.S. Cl.
CPC .............. *B24B 37/24* (2013.01); *B24B 37/10* (2013.01); *H01L 21/30625* (2013.01)

(58) Field of Classification Search
CPC .... B24B 37/24; B24B 37/10; H01L 21/30625
See application file for complete search history.

(56) References Cited

U.S. PATENT DOCUMENTS

| | | | |
|---|---|---|---|
| 8,349,042 B2* | 1/2013 | Miyatani | B24B 37/0056 438/690 |
| 8,932,952 B2 | 1/2015 | Ogata et al. | |
| (Continued) | | | |

FOREIGN PATENT DOCUMENTS

| | | |
|---|---|---|
| JP | 2001-338899 A | 12/2001 |
| JP | 2002-532874 A | 10/2002 |
| (Continued) | | |

OTHER PUBLICATIONS

Search Report issued in International Bureau of WIPO Patent Application No. PCT/JP2015/063824, dated Jul. 21, 2015, along with an English translation thereof.

(Continued)

*Primary Examiner* — Duy Vu N Deo
(74) *Attorney, Agent, or Firm* — Greenblum & Bernstein, P.L.C.

(57) ABSTRACT

A method of a polishing a wafer includes: a first polishing step of polishing a surface of the wafer while supplying a rough polishing liquid onto a polishing surface of a rough polishing cloth; subsequent to the first polishing step, a protection film formation step of supplying a protection film formation solution containing a water-soluble polymer to the rough polishing cloth after being used in the first polishing step and bringing the protection film formation solution into contact with the polished surface of the wafer to form a protection film on the polished surface; and a second polishing step of polishing the surface of the wafer where the protection film is formed while supplying a finish polishing liquid to a polishing surface of a finish polishing cloth different from the rough polishing cloth.

4 Claims, 16 Drawing Sheets

(56) References Cited

U.S. PATENT DOCUMENTS

| | | |
|---|---|---|
| 2009/0275268 A1* | 11/2009 | Ishida .................. B24B 37/042 451/41 |
| 2010/0032573 A1 | 2/2010 | Shelley et al. |
| 2011/0132255 A1 | 6/2011 | Kinbara et al. |
| 2012/0156878 A1 | 6/2012 | Ogata et al. |
| 2013/0032573 A1 | 2/2013 | Ogata et al. |
| 2013/0095660 A1 | 4/2013 | Tanimoto et al. |
| 2013/0109180 A1 | 5/2013 | Tanimoto et al. |
| 2015/0017890 A1* | 1/2015 | Masumura .............. B24B 37/30 451/286 |
| 2016/0122904 A1 | 5/2016 | Fukui |
| 2017/0011903 A1 | 1/2017 | Kozasa et al. |

FOREIGN PATENT DOCUMENTS

| | | |
|---|---|---|
| JP | 2011-42536 A | 3/2011 |
| JP | 5321430 B2 | 7/2013 |
| TW | 201137100 A | 11/2011 |
| WO | 2011/135949 A1 | 11/2011 |
| WO | 2012/002525 A1 | 1/2012 |

OTHER PUBLICATIONS

Office Action issued in Taiwan family member Patent Appl. No. 104112329, dated Mar. 17, 2016, along with a partial English translation thereof.

\* cited by examiner

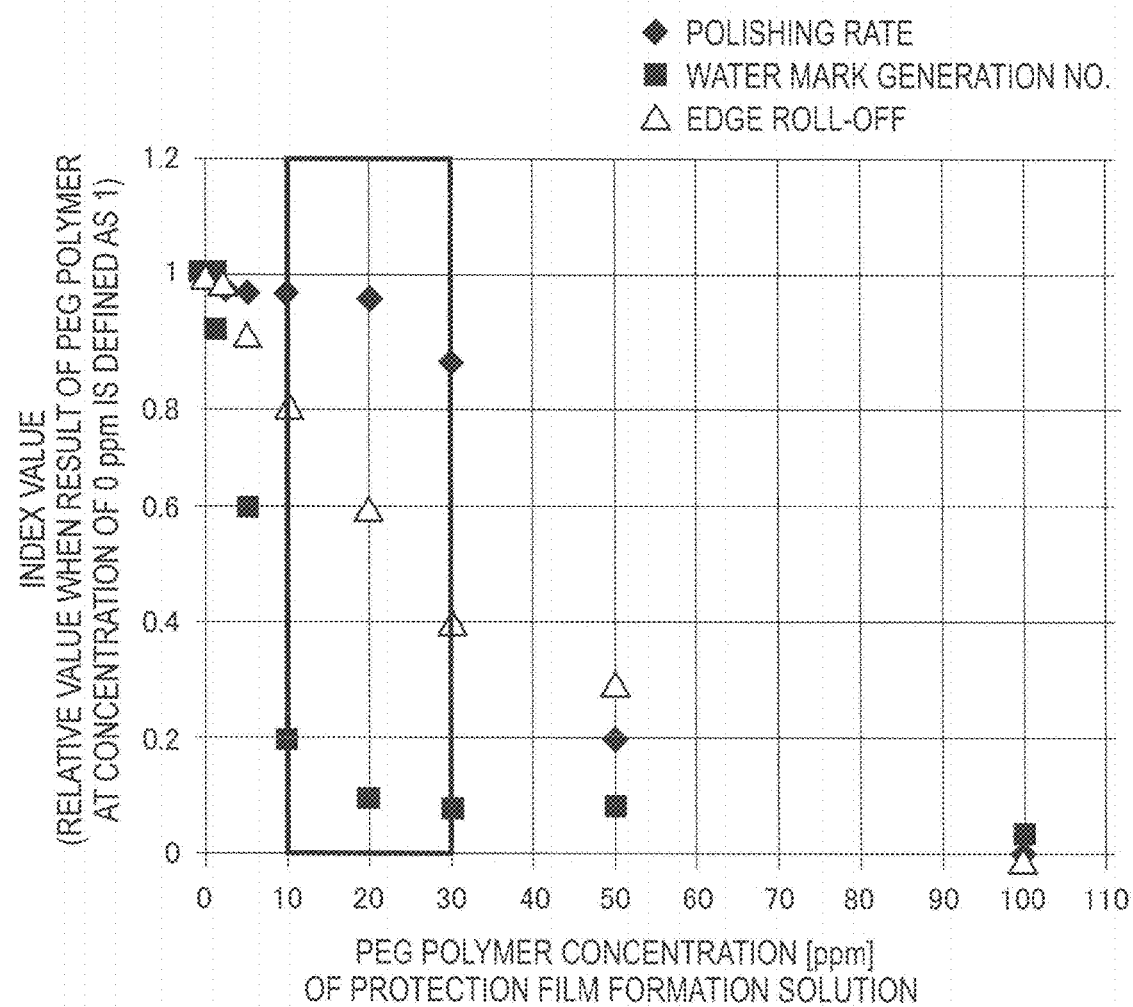

METHOD FOR POLISHING SILICON WAFER

TECHNICAL FIELD

The present invention relates to a method of polishing a silicon wafer.

BACKGROUND ART

In recent years, CMP (chemical mechanical polishing), which is performed by relatively rotating a silicon wafer and a polishing cloth while supplying a polishing liquid containing abrasive grains (e.g., silica particles) in an alkaline aqueous solution, is generally used as a method of a polishing a surface of a silicon wafer. The CMP is a composite technique of a mechanical polishing action by the abrasive grains and a chemical polishing action by the alkaline aqueous solution. It is well known that a high flatness of the surface of the silicon wafer is obtained by compositing the above two polishing actions. The CMP of the silicon wafer is typically performed by a plurality of steps from a double-side polishing step to a one-side polishing step.

The double-side polishing step is performed in order to polish the silicon wafer to a desired thickness. Specifically, a front side and a rear side of the silicon wafer are simultaneously polished with a hard polishing cloth made of polyurethane and the like at a relatively high polishing speed. This double-side polishing flattens the silicon wafer so as to decrease a fluctuation in a thickness of the polished silicon wafer and removes waviness components (e.g., nanotopography).

The one-side polishing step is performed in order to improve roughness of one of surfaces of the silicon wafer after being subjected to the double-side polishing. Specifically, the one-side polishing step is performed with a soft polishing cloth such as a suede cloth in combination with micro abrasive grains so as to reduce micro roughness of the one of surfaces of the silicon wafer (e.g., nanotopography and haze). The one-side polishing step is performed at a plurality of stages with a variation of a type of the polishing cloth, a size of the abrasive grains and an alkali concentration in the polishing liquid.

As a technique relating to the one-side polishing step in order to improve a haze of a surface of the silicon wafer, there have been disclosed: an abrasive agent used for a mirror-finish polishing of the silicon wafer, the abrasive agent containing alkaline silica, a water-soluble polymer, and a cyclic organic compound; and a method of polishing the silicon wafer using the abrasive agent (see Patent Literature 1).

CITATION LIST

Patent Literature(s)

Patent Literature 1: Japanese Patent No. 5321430

SUMMARY OF THE INVENTION

Problem(s) to be Solved by the Invention

As reported also in Patent Literature 1, in the one-side polishing step, the water-soluble polymer is generally added into the polishing liquid in order to reduce the haze level of the surface of the silicon wafer.

On a top surface layer of the silicon wafer after being subjected to the double-side polishing step, process damage (strain) induced by the mechanical action of the double-side polishing remains. Accordingly, in the subsequent one-side polishing step, it is necessary to polish the silicon wafer so as to remove the process damage. However, since the polishing speed (polishing rate) is considerably decreased when the water-soluble polymer is added in the polishing liquid, a considerably long time and considerably many steps are required for removing the process damage.

With respect to the above problem, the silicon wafer after being subjected to the double-side polishing step is polished with the polishing liquid in which no water-soluble polymer is added in a first one-side polishing treatment (hereinafter, also referred to as a rough polishing), so that the process damage can be removed without decreasing the polishing speed. In the second and subsequent one-side polishing treatments (hereinafter, also referred to as a finish polishing), the silicon wafer is polished with the polishing liquid in which the water-soluble polymer is added, so that the silicon wafer can have a desired surface roughness.

However, experiments by the inventors have revealed that, when an epitaxial growth treatment is applied on the surface of the silicon wafer manufactured by the above rough polishing and finish polishing, many micro LPD (Light Point Defect) each having a size of 45 nm or less are formed on the surface of the manufactured epitaxial silicon wafer. Moreover, the inventors have found as described later that water mark defects are generated on the surface of the silicon wafer after being subjected to the rough polishing and the water mark defects cause generation of the micro LPD of the epitaxial silicon wafer.

An object of the invention is to provide a method of polishing a surface of a silicon wafer, the method being capable of reducing generation of water mark defects on the surface of the silicon wafer in a one-side polishing step.

Means for Solving the Problem(s)

The inventors diligently studied a cause of generation of micro LPD on a surface of an epitaxial silicon wafer.

In order to research the cause, with respect to the epitaxial silicon wafer having the micro LPD on the surface thereof, a map of the LPD was observed and substantial observation of the LPD was made using an atomic force microscope (AFM). Moreover, the substantial observation of the LPD was made using a wafer defect inspection system (MAWS manufactured by Lasertec Corporation) and AFM, thereby classifying the detects of the LPD.

Figure 3:
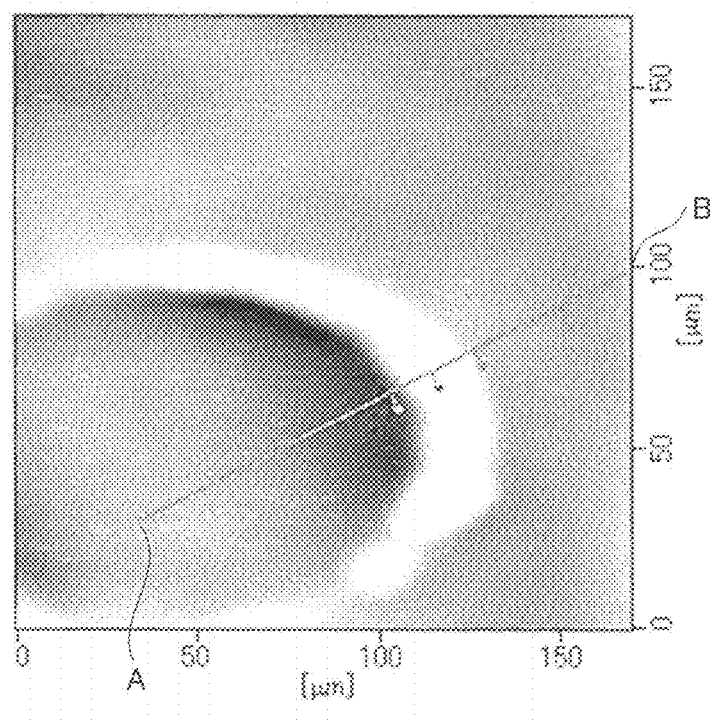
Figure 4:
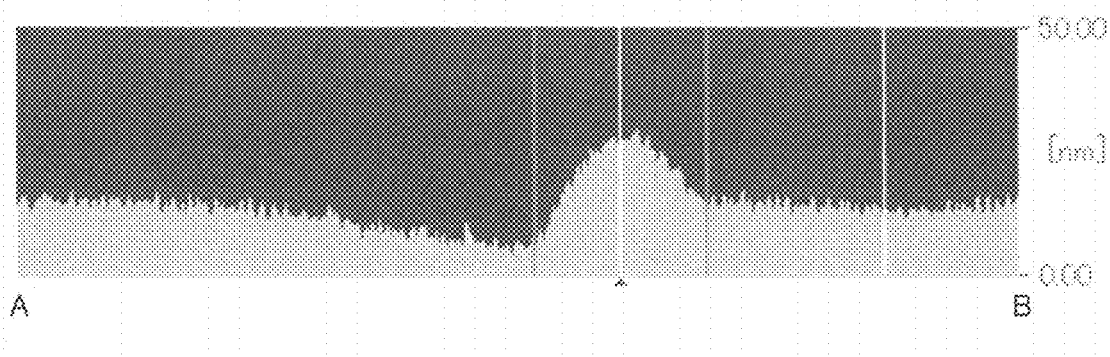

FIG. 3 shows an AFM image of the micro concave defect observed on the surface of the epitaxial silicon water. FIG. 4 shows a difference in height of a top surface between A and B in FIG. 3. As apparently understood from FIGS. 3 and 4, the micro concave defect actually observed on the surface of the epitaxial silicon wafer is a crater-shaped micro concave defect having a diameter of about 26 μm and a height of about 15 nm and having an annularly bulging periphery.

It is inferred from the results that the micro concave defect determines a degree of the number of the micro LPD.

Next, a cause of generation of the micro concave defect on the surface of the epitaxial silicon wafer was researched. Specifically, the surface of the silicon wafer before being subjected to the epitaxial growth treatment was observed in DIC mode using a surface defect inspection device (Surfscan SP-2: manufactured by KLA-Tencor Corporation), with respect to coordinate positions where defects each having a concave with a level difference of 3 nm or more and coordinate positions where micro concave defects were observed on the surface of the epitaxial silicon wafer. In comparison between both the above coordinate positions, it was confirmed that the coordinate positions where the defects each having a concave with a level difference of 3 nm or more substantially coincide with the coordinate positions where the micro concave defects were observed.

Figure 5:
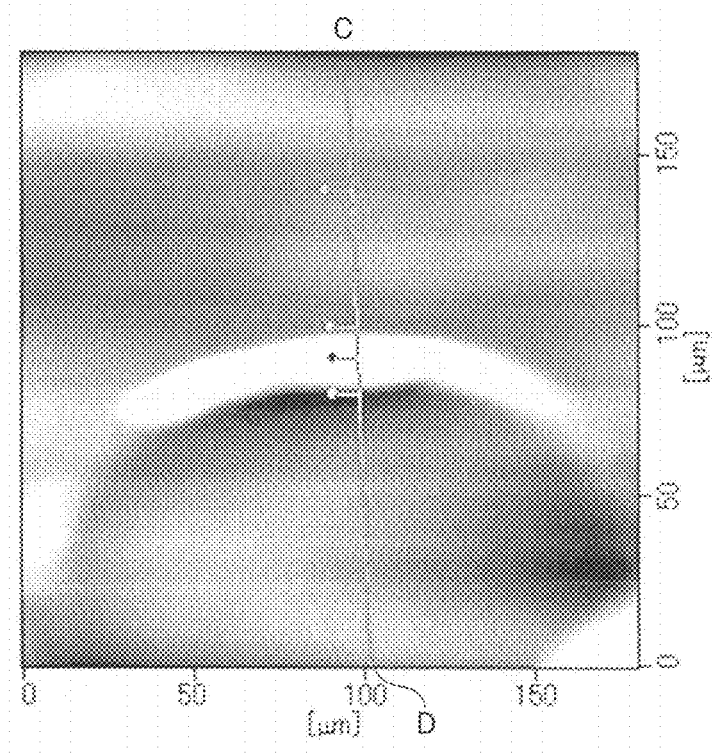
Figure 6:
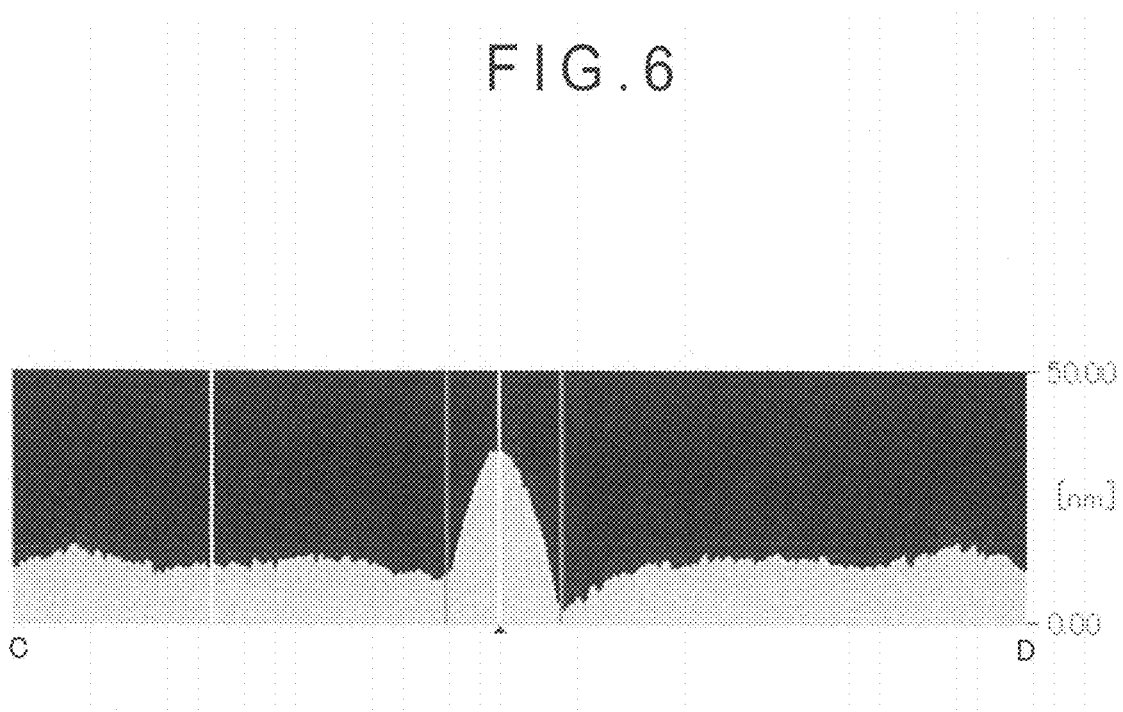

Accordingly, a substantial observation was made using AFM on a portion where the defect was observed on the surface of the silicon wafer. The results are shown in FIG. 5. FIG. 6 shows a difference in height of the top surface between C and D in FIG. 5. As apparently understood from FIGS. 5 and 6, similarly to the micro concave defect observed on the surface of the epitaxial silicon wafer, it was confirmed that the micro concave defect actually observed on the surface of the silicon wafer was a crater-shaped defect having a diameter of about 20 μm and a height of about 22 nm and having an annularly bulging periphery (hereinafter, referred to as a water mark defect).

Since the annular water mark defect observed on the surface of the silicon wafer has a central part thinner than a periphery, it is inferred that a reaction in which the water mark defect is formed is accompanied by etching. Specifically, it is inferred that the water mark defect generated on the surface of the silicon wafer is caused by a phenomenon in which an aqueous solution containing an alkaline component and the like is present in a form of water drops on the surface of the silicon wafer, the surface of the silicon wafer is etched by the alkaline component in the aqueous solution and, simultaneously, oxygen in the air enters the water drops to react with the alkaline component, resulting in forming a reactant salt.

A step where this phenomenon possibly occurs was confirmed to be the one-side polishing step in which the water mark defect was generated during the delivery of the silicon wafer in the air in the transition from the rough polishing to the finish polishing.

Probably, it is considered that the water mark defect is formed since the water drops containing a polishing slurry component remain on the surface of the silicon wafer after being subjected to the rough polishing step in the one-side polishing step.

Figure 7:
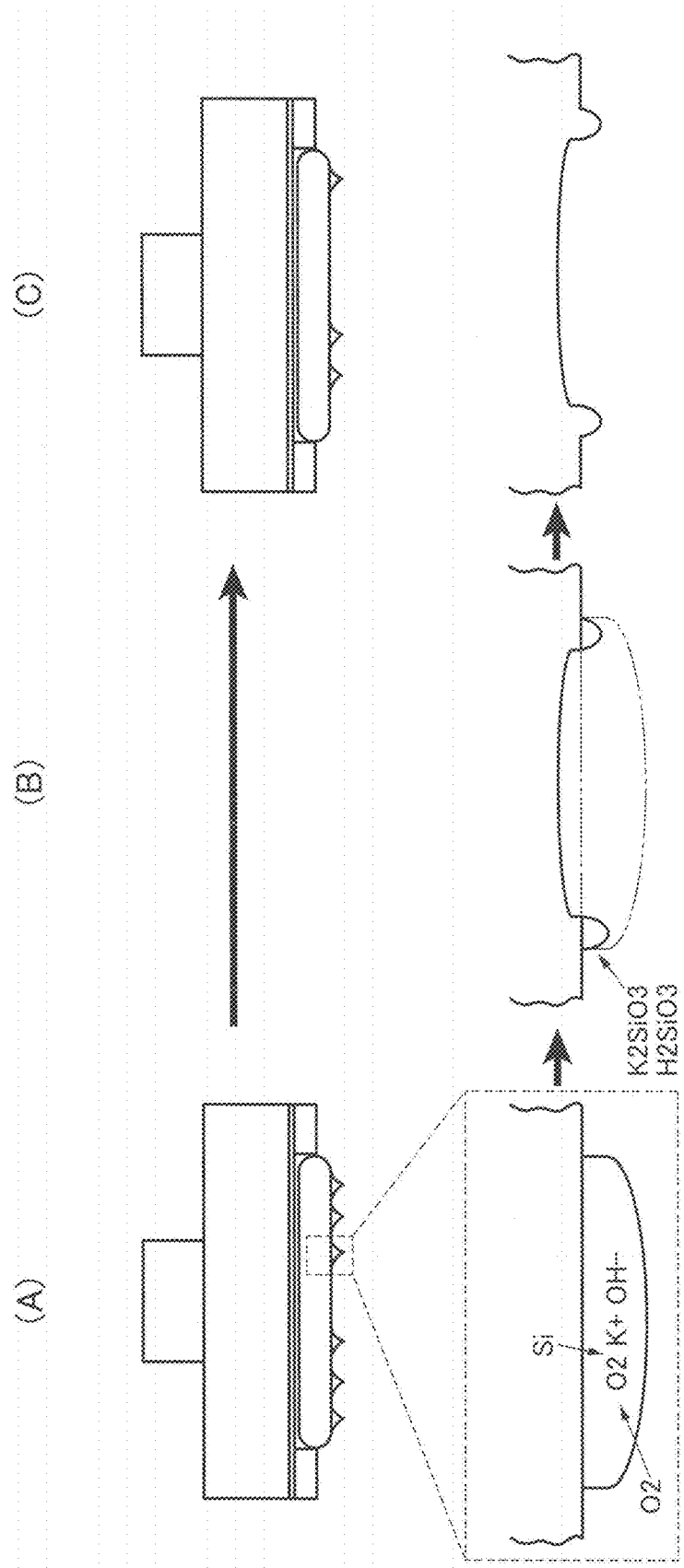

FIG. 7 shows an estimated mechanism of generating the water mark defect, A lower section of FIG. 7 corresponds to an upper section and shows a partially enlarged view of a top surface layer of the silicon wafer.

After the rough polishing step is finished in the one-side polishing step, the polishing slurry having been used in the rough polishing is present as a residue on the polished surface of the silicon wafer. The polished surface is hydrophobic. Accordingly, as shown in the upper section of FIG. 7(A), water drops containing the polishing slurry are formed on the polished surface. As shown in the lower section of FIG. 7(A), the alkaline component (represented by $K^-$ and $O^-$ in the figure) derived from the polishing slurry is present in the water drops. Moreover, at parts in contact with the water drops on the top surface layer of the silicon wafer, silicon (represented by Si in the figure) of the top surface layer is eluted and captured into the water drops. In the transition from after the rough polishing is finished to the next finish polishing, oxygen (represented by $O_2$ in the figure) present in the air is captured into the water drops while the polishing head is placed at a raised position.

Next, after the rough polishing is finished, the silicon wafer is delivered in a dry condition in the air while being attached to the polishing head to proceed to the next step of the finish polishing.

While the silicon wafer is delivered in the air, KOH in the water drops etches Si at parts of the polished surface to which the water drops are attached. By this etching reaction, $K_2SiO_3$ and $H_2SiO_3$ are formed. The water drops are evaporated during the delivery of the silicon water in the air. Accordingly, the formed $K_2SiO_3$ and $H_2SiO_3$ remain in a manner to be accumulated on the periphery where the water drops are previously present (see the lower section of FIG. 7(B)).

In the finish polishing, the polished surface of the silicon wafer is subjected to the finish polishing (see the upper section in FIG. 7(C)). Since a polishing amount is small in the finish polishing, the water mark defect formed during the delivery of the silicon wafer in the air is not completely removed, so that a crater-shaped water mark defect remains on the surface of the silicon water after being subjected to the finish polishing (see the lower section in FIG. 7(C)).

It should be noted that the water mark defect is defined as an annular defect having a height of at least about 10 nm and a diameter of at least about 10 μm when a substantial observation is made on defects each having a concave with a level difference of 3 nm or more in DIC mode using a surface defect inspection device (Surfscan SP-2: manufactured by KLA-Tencor Corporation)

As described above, it has been found that the generation of the micro LPD on the surface of the epitaxial silicon wafer is caused by the water mark defect formed on the silicon wafer during the delivery of the silicon wafer in the air in the transition from the rough polishing to the finish polishing in the one-side polishing step.

The invention has been reached based on the above findings.

According to an aspect of the invention, a method of polishing a silicon wafer, includes: a first polishing step of polishing a surface of the silicon wafer while supplying to a polishing cloth a first polishing liquid containing: a primary agent in a form of an alkaline aqueous solution; and abrasive grains, the first polishing liquid containing no water-soluble polymer; subsequent to the first polishing step, a protection film formation step of supplying a protection film formation solution containing a water-soluble polymer to the polishing cloth after being used in the first polishing step, and bringing the protection film formation solution into contact with the polished surface of the silicon wafer subjected to the first polishing step to form a protection film on the polished surface; and a second polishing step of polishing the surface of the silicon wafer where the protection film is formed while supplying, to a polishing cloth different from the polishing cloth used in the first polishing step, a second polishing liquid containing: a primary agent in a form of an alkaline aqueous solution; abrasive grains; and a water-soluble polymer.

According to the above aspect of the invention, in the protection film formation step to be performed subsequent to the first polishing step, the protection film formation solution containing the water-soluble polymer is brought into contact with the polished surface of the silicon wafer. By this operation, the protection film is formed on the polished surface of the silicon wafer after being subjected to the first polishing step.

The protection film protects the polished surface from oxygen in the air during the delivery of the silicon water in the air in the transition from the first polishing step (rough polishing) to the second polishing step (finish polishing). Although the used polishing liquid remains in the polished surface after the rough polishing is finished, the protection film functions as an etching stopper for inhibiting etching by the alkaline component contained in the polishing liquid.

Since the protection film thus prevents the polished surface from being exposed in the air, a reaction between the polished surface and oxygen in the air is inhibited. Moreover, the polished surface is free from being etched by the alkaline component remaining in the polishing liquid. Accordingly, in the one-side polishing step, generation of the water mark defect is reducible during the delivery of the silicon wafer in the air in the transition from the rough polishing to the finish polishing. Consequently, the micro concave defect caused by the water mark defect is reducible on the manufactured epitaxial silicon wafer.

In general, a polishing cloth used in the one-side polishing step is softer than a polishing cloth used in the double-side polishing step. Accordingly, since the polishing of the silicon wafer proceeds with the silicon wafer kept sunk in the polishing cloth, an effect by a reaction force of the polishing cloth to return becomes large on the periphery of the wafer, thereby generating a peripheral shear drop of the wafer, which is called "edge roll-off."

In the initial period of the rough polishing, a temperature of heat generated by the polishing is high at the central part of the wafer and low at the periphery. Accordingly, with respect to a native oxide film present on the surface of the wafer before being subjected to the rough polishing, the native oxide film present at the central part of the wafer where the generated heat is high tends to be removed first and followed by the removal of the native oxide film present at the periphery.

In the protection film formation step, since the protection film is formed on the polished surface while the protection film formation solution containing the water-soluble polymer is supplied onto the polishing surface of the rough polishing cloth, the water-soluble polymer remains in the rough polishing cloth. Accordingly, in the first polishing step in the next cycle, the rough polishing is performed with the rough polishing cloth in which the water-soluble polymer remains. In this case, due to the water-soluble polymer, removability of the native oxide film from the surface of the silicon wafer is reduced.

Accordingly, since the removability of the native oxide film is reduced in the rough polishing using the rough polishing cloth in which the water-soluble polymer remains, the polishing amount on the periphery of the wafer is reduced as the removal of the native oxide film from the surface of the wafer is delayed. In other words, by applying the polishing method according to the above aspect of the invention, the amount of the edge roll-off of the silicon wafer in the rough polishing at the next and subsequent cycles can be reduced.

In the above aspect of the invention, the water-soluble polymer in the protection film formation solution preferably has a concentration ranging from 10 ppm to 30 ppm.

With this arrangement, as long as the concentration of the water-soluble polymer in the protection film formation solution falls within the above range in the protection film formation step, the protection film can be formed on the polished surface of the silicon wafer to have a thickness to the extent that generation of the water mark defect can be inhibited. Moreover, as long as the concentration of the water-soluble polymer falls within the above concentration range, the amount of the water-soluble polymer remaining in the rough polishing cloth is small enough not to impair the rough polishing. Accordingly, the polishing rate is not drastically decreased also in the rough polishing in the next cycle. Further, as long as the concentration of the water-soluble polymer falls within the above concentration range, the thickness of the protection film formed on the polished surface of the silicon wafer in the protection film formation step is about several hundred Å (several ten nm), which enables to remove the protection film formed on the surface of the wafer in a short time in the subsequent finish polishing.

In the above aspect of the invention, the water-soluble polymer used in the protection film formation solution is preferably a polymer compound having a cellulose structure or a nonionic polymer compound. Specifically, the polymer compound having a cellulose structure is exemplified by hydroxyethylcellulose. Examples of the nonionic polymer compound include polyvinyl alcohol, polyacrylamide, polyvinylpyrrolidone, polyethyleneglycol, polypropyleneglycol, and polyethylene oxide, among which one or a plurality of the polymer compound may be contained. By using such a water-soluble polymer, the protection film can easily be formed on the polished surface of the silicon wafer.

BRIEF DESCRIPTION OF DRAWING(S)

Figure 1:
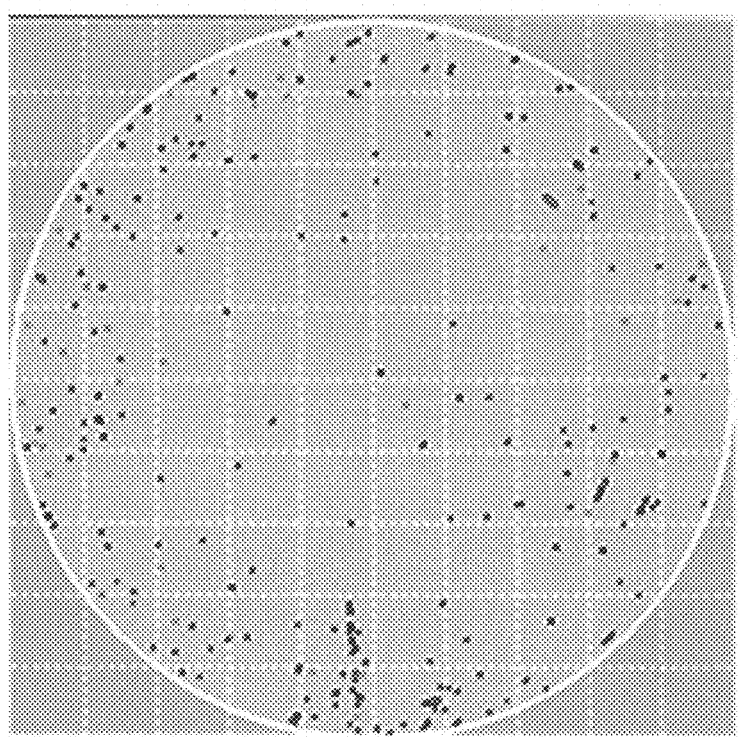
FIG. 1 is the map of the LPD observed on the surface of the epitaxial silicon wafer, which shows that many micro LPD are scattered on the surface of the epitaxial silicon wafer.

FIG. 1 is a map of LPD generated on a surface of an epitaxial silicon wafer.

Figure 2:
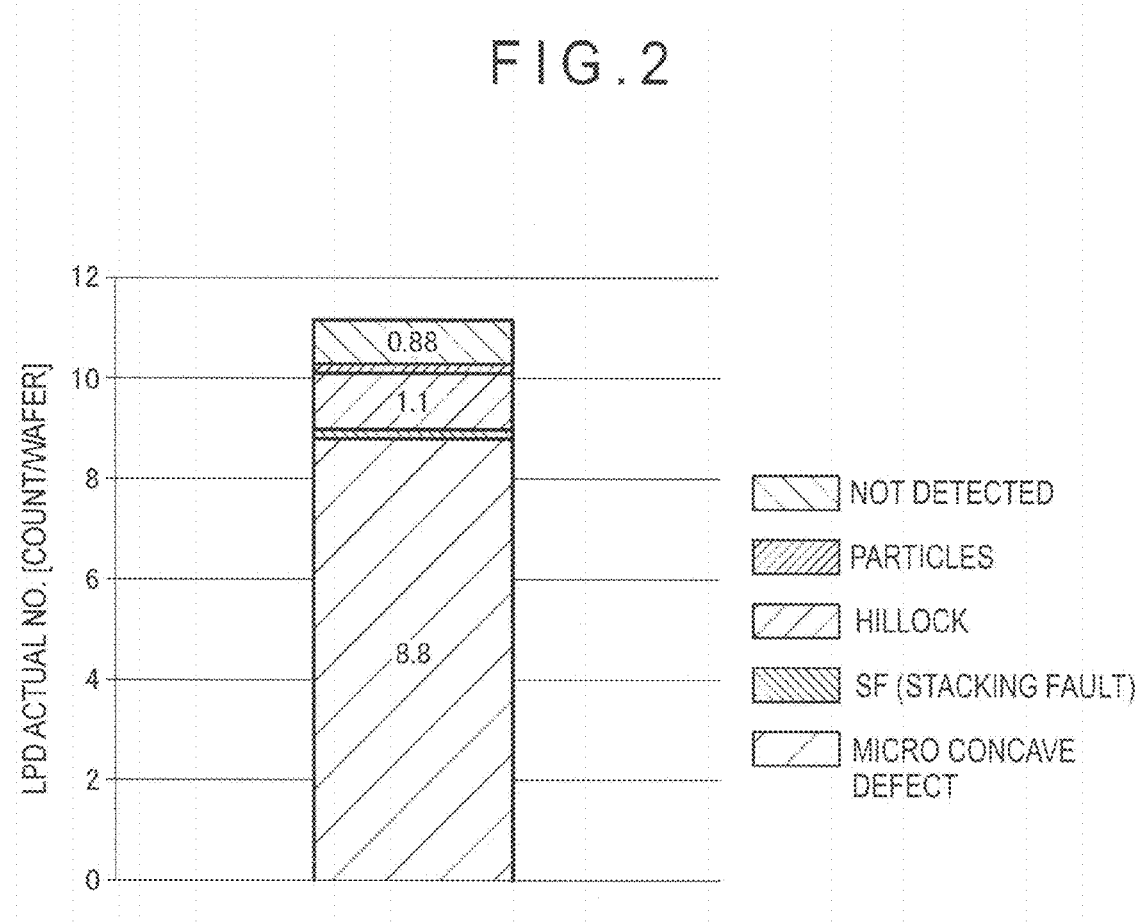
FIG. 2 is a graph showing the results of the defect classification of the LPD observed on the surface of the epitaxial silicon wafer. It is understood from the graph that the number of the micro concave defect is larger than that of a typical epitaxial defect such as SF (stacking fault) and hillock.

FIG. 2 shows a defect classification result of the micro LPD present on the surface of the epitaxial silicon wafer.

FIG. 3 shows an AFM image of a micro concave defect having a 26-μm diameter and a 15-nm height, the defect being present on the surface of the epitaxial silicon wafer.

FIG. 4 shows a difference in height of a top surface between A and B in FIG. 3.

FIG. 5 shows an AFM image of a water mark defect having a 20-μm diameter and a 22-nm height, the defect being present on the surface of the epitaxial silicon wafer.

FIG. 6 shows a difference in height of the top surface between C and D in FIG. 5.

FIG. 7 shows an estimated mechanism of generating the water mark defect.

Figure 8:
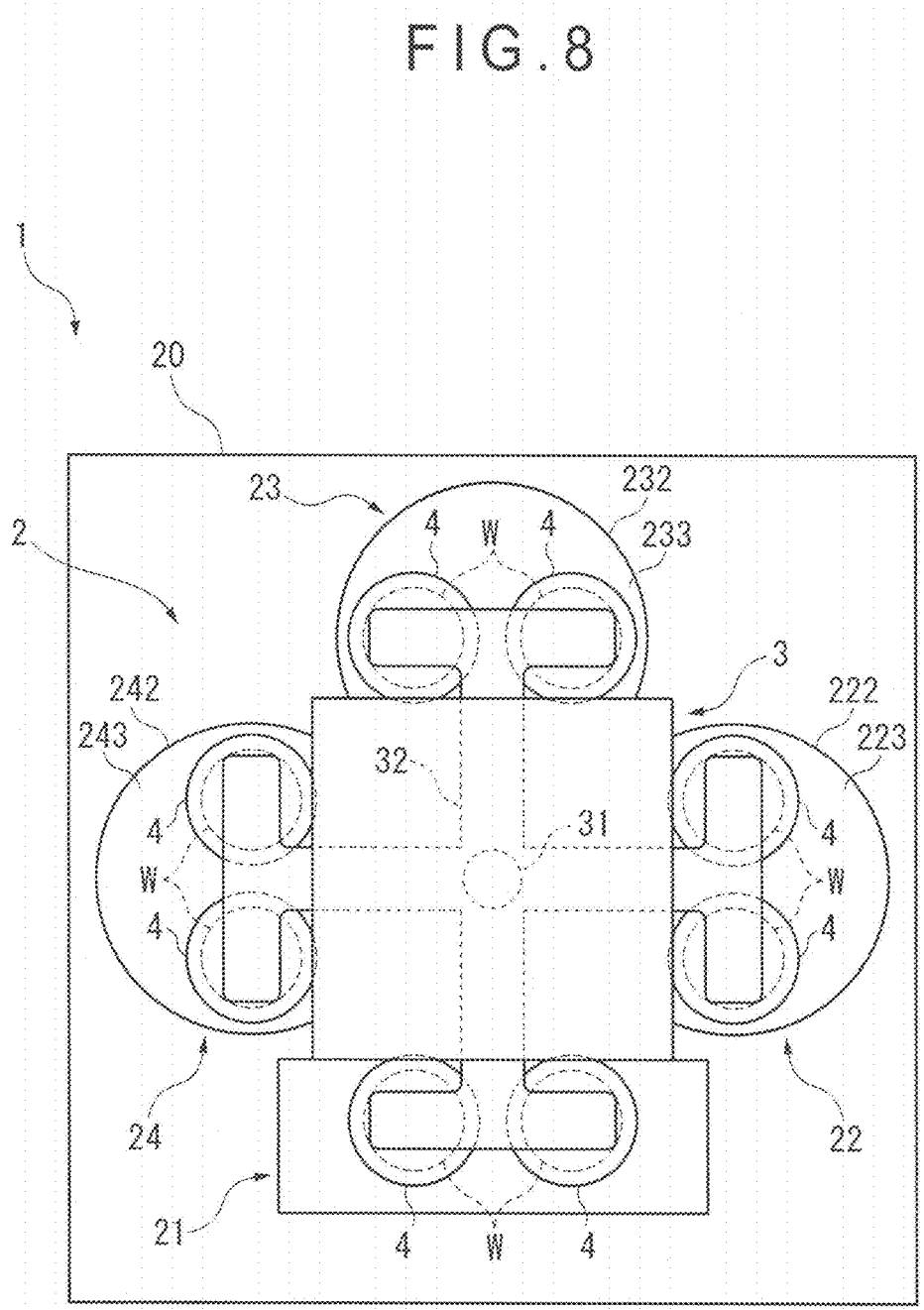

FIG. 8 is a plan view showing an entirety of a polishing device according to an exemplary embodiment of the invention.

Figure 9:
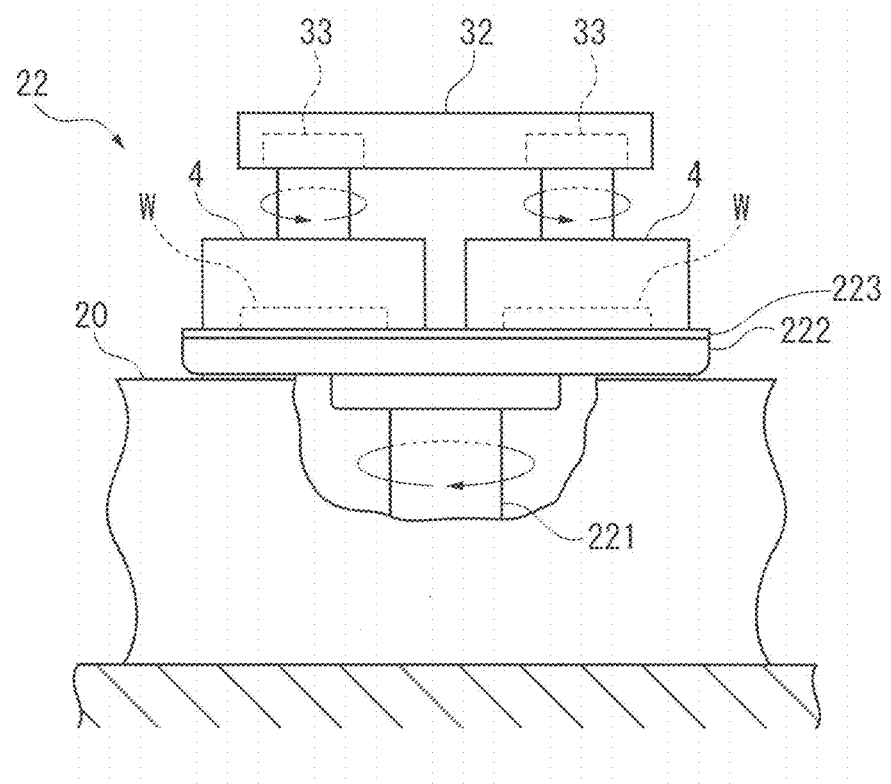

FIG. 9 is a partially cutaway side view of the polishing device according to the exemplary embodiment.

Figure 10:
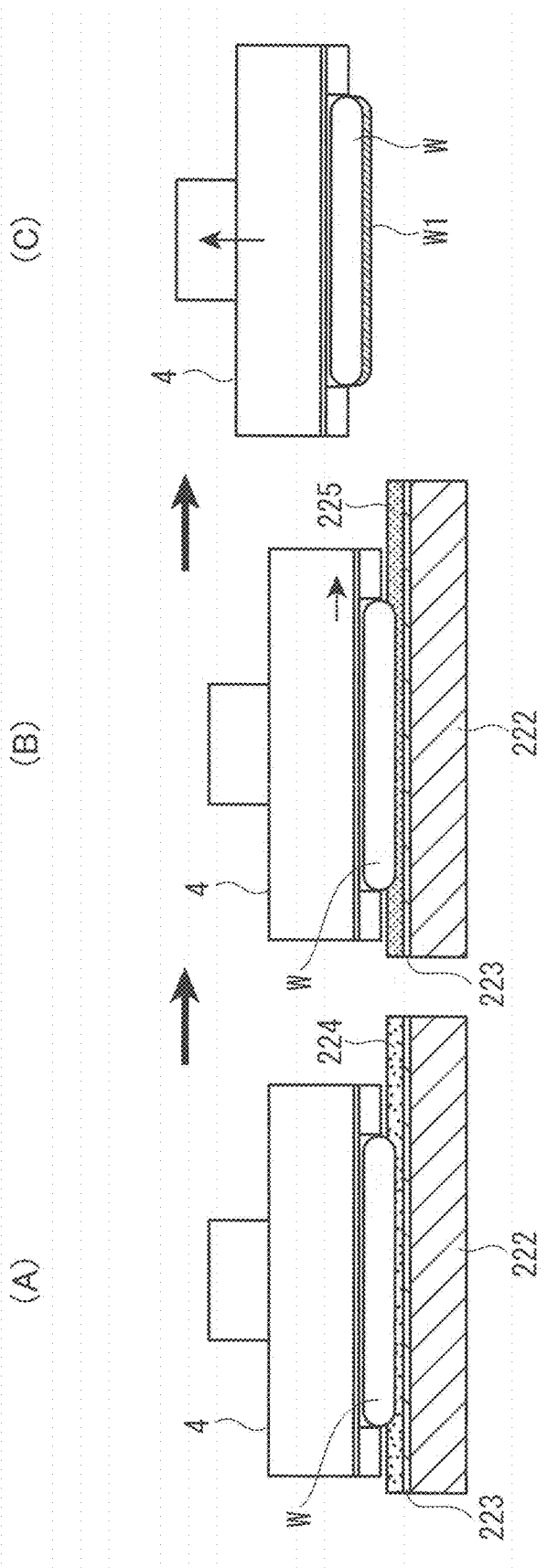

FIG. 10 shows a protection film formation process in the exemplary embodiment.

Figure 11:
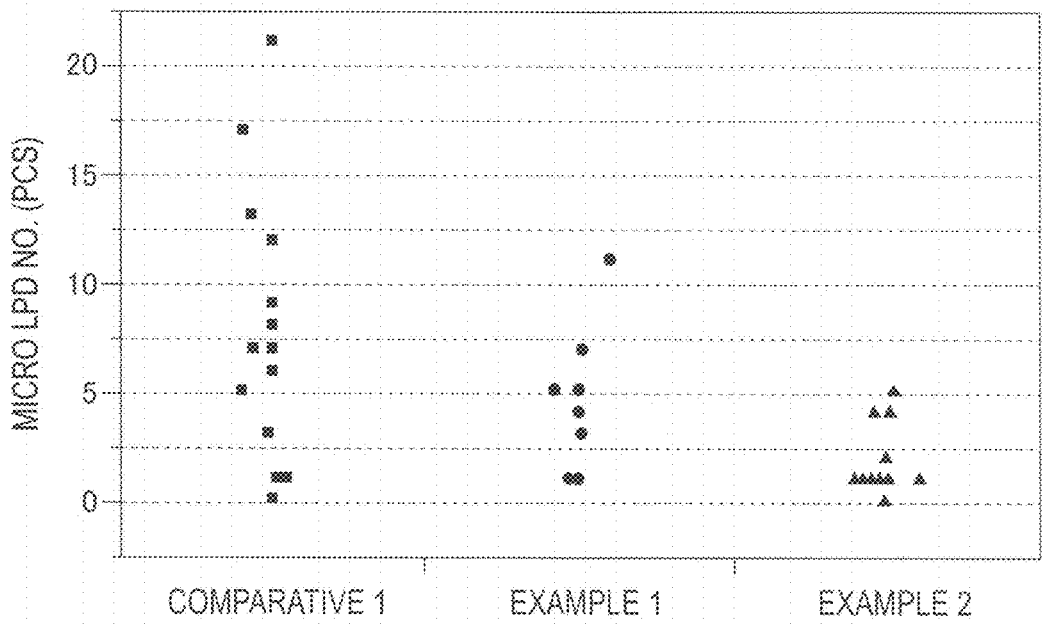

FIG. 11 shows the number of the micro LPD generated on the surface of the epitaxial silicon wafer in each of Example 1, Example 2 and Comparative 1.

Figure 12:
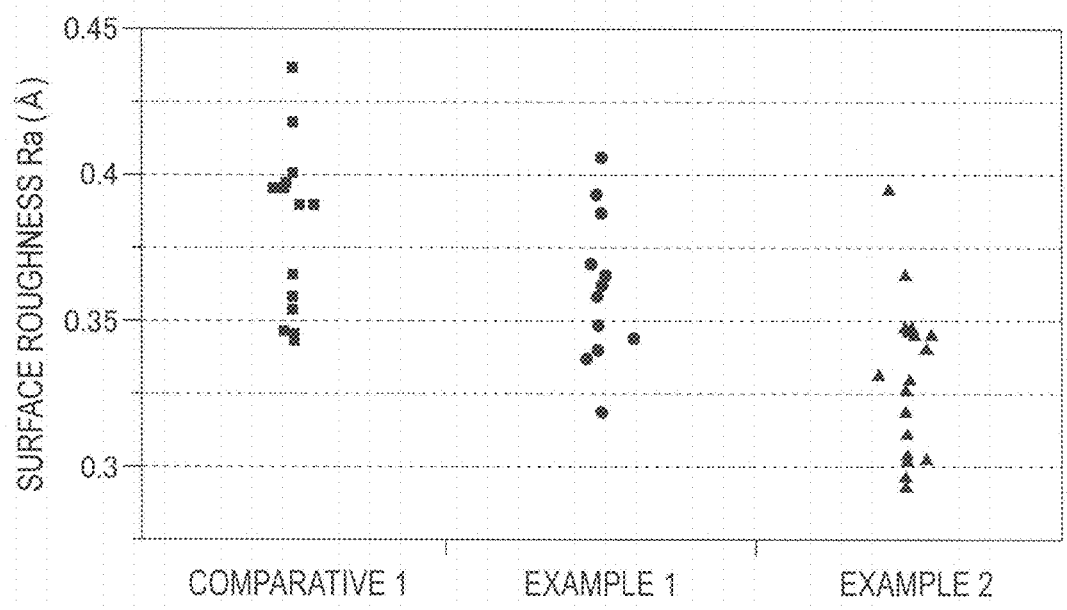

FIG. 12 shows a surface roughness Ra of the silicon wafer in each of Example 1, Example 2 and Comparative 1.

Figure 13:
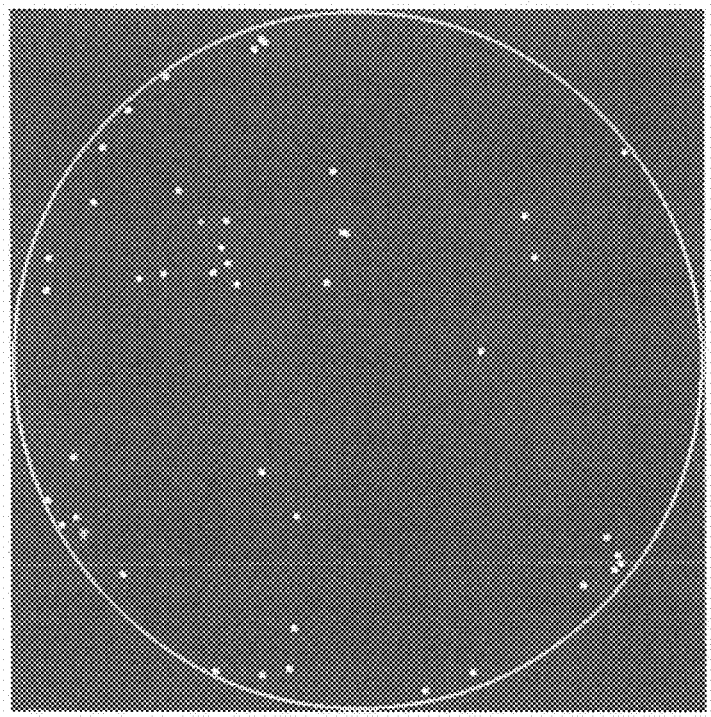

FIG. 13 is a map of LPD generated on the surface of the epitaxial silicon wafer in Example 1.

Figure 14:
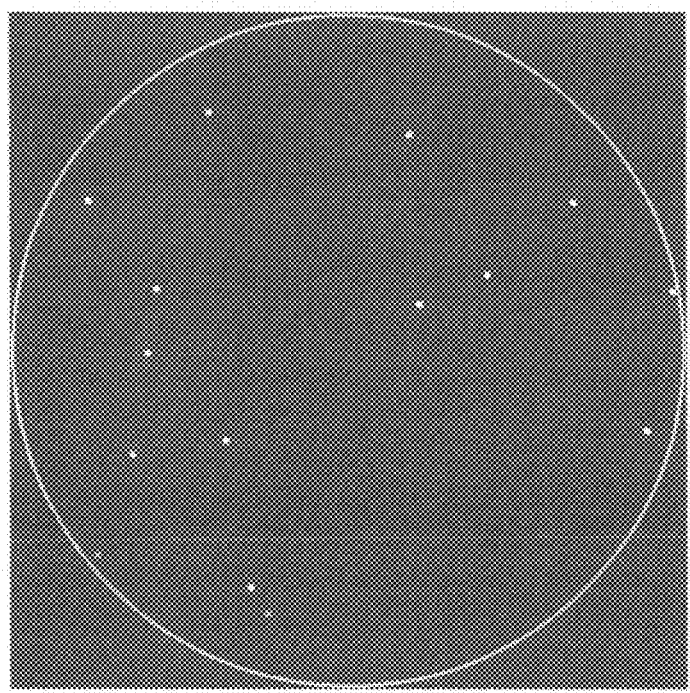

FIG. 14 is a map of LPD generated on the surface of the epitaxial silicon wafer in Example 2.

Figure 15:
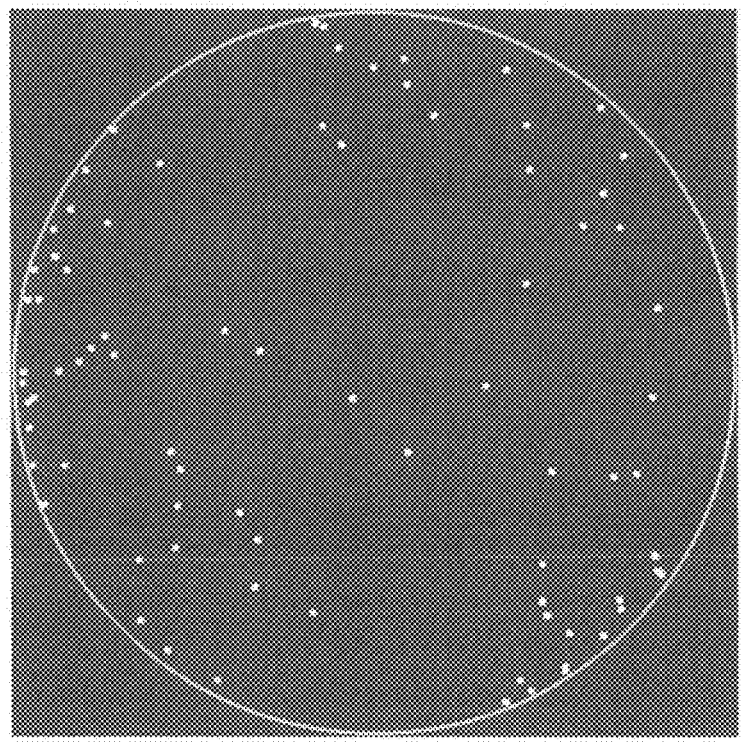

FIG. 15 is a map of LPD generated on the surface of the epitaxial silicon wafer in Comparative 1.

FIG. 16 shows a relationship between a concentration of the water-soluble polymer and the number of the water mark defect in Example 3.

DESCRIPTION OF EMBODIMENT(S)

Exemplary embodiment(s) of the invention will be described below with reference to the attached drawings.

Arrangement of Polishing Device of Wafer

FIG. 8 is a plan view showing an entirety of a polishing device according to an exemplary embodiment of the invention. FIG. 9 is a partially cutaway side view of the polishing device according to the exemplary embodiment.

As shown in FIG. 8, a polishing device 1 is a device configured to polish a surface of a wafer W using a polishing slurry at a plurality of stages. Specifically, the polishing device 1 is configured to perform a rough polishing treatment of the wafer W, a first finish polishing treatment of polishing the wafer W to have a finer surface roughness than that in the rough polishing treatment, and a second finish polishing treatment of polishing the wafer W to have a finer surface roughness than that in the first finish polishing treatment. Although the finish polishing treatment has two stages including the first finish polishing treatment and the second finish polishing treatment in the exemplary embodiment, the finish polishing treatment may be performed by a single stage.

As shown in FIG. 8, the polishing device 1 includes: a polishing unit 2 provided in a box-shaped case 20; a wafer holding-rotating unit 3 provided on a top of the polishing unit 2; and a polishing head 4 provided to the wafer holding-rotating unit 3.

The polishing unit 2 is configured to, for instance, clean the polishing head 4 and polish and rinse the water W as needed. The polishing unit 2 includes a cleaning unit 21, a rough polishing unit 22, a first finish polishing unit 23, and a second finish polishing unit 24, which are disposed along a periphery of a top surface of the case 20. It should be noted that, since the rough polishing unit 22, the first finish polishing unit 23, and the second finish polishing unit 24 have the same arrangement, the rough polishing unit 22 will be described in detail and the description of the first finish polishing unit 23 and the second finish polishing unit 24 will be simplified.

Cleaning Unit 21

The wafer W is mounted on the cleaning unit 21 as needed. The wafer W is polished by the rough polishing unit 22 and the like while being held by the polishing head 4. The polished wafer W is again mounted on the cleaning unit 21 by the polishing head 4. The wafer W is delivered outside as needed. Further, the cleaning unit 21 is configured to clean the polishing head 4 positioned at an upper side of the cleaning unit 21.

Rough Polishing Unit 22

As shown in FIGS. 8 and 9, the rough polishing unit 22 includes: a surface-plate rotary driving unit 221 provided in the case 20; a disc-shaped rough polishing surface-plate 222 provided to a rotary shaft of the surface-plate rotary driving unit 221; a rough-polishing-liquid supply unit (not shown); and a protection-film-formation-solution supply unit (not shown).

A rough polishing cloth 223 is provided on an upper surface of the rough polishing surface-plate 222. The rough-polishing-liquid supply unit supplies the rough polishing liquid as needed onto a polishing surface of the rough polishing cloth 223. The protection-film-formation-solution supply unit supplies the protection film formation solution as needed onto the polishing surface of the rough polishing cloth 223.

First Finish Polishing Unit 23

The first finish polishing unit 23 includes: a surface-plate rotary driving unit 231; a first finish polishing surface-plate 232; a first-finish-polishing-liquid supply unit configured to supply a first finish polishing liquid onto a polishing surface of a first finish polishing cloth 233; and a rinse liquid supply unit.

Second Finish Polishing Unit 24

The second finish polishing unit 24 includes: a surface-plate rotary driving unit 241; a second finish polishing surface-plate 242; a second-finish-polishing-liquid supply unit configured to supply a second finish polishing liquid onto a polishing surface of a second finish polishing cloth 243; and a rinse liquid supply unit.

The wafer holding-rotating unit 3 is configured to hold and rotate the wafer W to deliver the wafer W in the air to the cleaning unit 21, the rough polishing unit 22, the first finish polishing unit 23, and the second finish polishing unit 24 in this order. The wafer holding-rotating unit 3 includes: a support spindle 31 disposed in the case 20; and a support 32 shaped in a substantially cruciform box in a plan view and provided to a rotary shaft of the support spindle 31. Two polishing heads 4 are provided to each of ends of the cruciform support 32. A head rotary driving unit 33 configured to rotate each of the polishing heads 4 is provided inside the support 32.

In the rough polishing unit 22, the surface-plate rotary driving unit 221 and the head rotary driving unit 33 define a rotary driving unit. In the first finish polishing unit 23, the surface-plate rotary driving unit 231 and the head rotary driving unit 33 in combination define a rotary driving unit. In the second finish polishing unit 24, the surface-plate rotary driving unit 241 and the head rotary driving unit 33 in combination define a rotary driving unit.

Action of Polishing Device of Wafer

Next, a method of polishing the wafer W will be described in association with an action of the above polishing device 1.

First, the support 32 is lowered, whereby the wafer W placed on the cleaning unit 21 is sucked and held by a wafer chuck (not shown) of the polishing head 4. Next, the support 32 is moved upward and subsequently rotated by 90 degrees to move the polishing head 4 holding the wafer W to a position above the rough polishing unit 22.

First Polishing Step

The support 32 is lowered while the head rotary driving unit 33 rotates the polishing head 4. While the rough polishing liquid 224 is supplied onto the rough polishing cloth 223, the wafer W held by the polishing head 4 is brought into contact with the polishing surface of the rotating rough polishing cloth 223. With this operation, as shown in FIG. 10(A), the rough polishing is applied to the wafer W while the wafer W is pressed onto the rough polishing cloth 223 in the presence of the rough polishing liquid 224.

The rough polishing cloth 223 may be a velour cloth or a suede cloth. It is desirable to select a relatively hard cloth in order to increase the polishing rate.

The first polishing step corresponds to the rough polishing step in the one-side polishing step and is performed in order to remove a native oxide film formed on a surface of the wafer W, leading to a removal of process damage on the surface of the wafer W. The rough polishing liquid 224 to be used in the first polishing step contains abrasive grains in order to increase the polishing rate. Examples of the abrasive grains include colloidal silica, ceria, diamond and alumina.

The rough polishing liquid 224 contains no water-soluble polymer. Since the water-soluble polymer considerably decreases the polishing rate, it is not suitable that the rough polishing liquid 224 requiring a high polishing rate contains the water-soluble polymer. However, as long as the water-soluble polymer falls within a concentration range in which no protection film W1 is formed on a polished surface of the wafer W after being subjected to the rough polishing and the polishing rate is not impaired, a slight amount of the water-soluble polymer may be contained in order to inhibit aggregation of the abrasive grains.

As the rough polishing liquid 224, it is desirable to use an alkaline aqueous solution containing a main alkaline agent and having an adjusted pH ranging from 8 to 13. Representative examples of the alkaline agent include potassium hydroxide, sodium hydroxide, lithium hydroxide, tetramethylammonium hydroxide, and piperazine. In addition, the alkaline aqueous solution is exemplified by an ammonium carbonate aqueous solution and an alkaline aqueous solution added with a specific amine.

Other polishing conditions in the first polishing step include a polishing time, a rotation speed of the polishing head 4, a contact pressure of the wafer W and the like and may be appropriately set depending on a desired polishing amount.

After the first polishing step is finished, the supply of the rough polishing liquid 224 is stopped.

Protection Film Formation Step

Next, subsequent to the first polishing step, a protection film formation step is performed. The protection film formation step is performed in order to prevent the water mark defect from being generated on the polished surface of the wafer W typically in a transition from the rough polishing to the finish polishing.

Referring back to FIG. 8, in the protection film formation step after the first polishing step, the protection film formation solution containing a water-soluble polymer is supplied onto the polishing surface of the rough polishing cloth 223 while the polishing surface of the rough polishing cloth 223 is in contact with the polished surface of the wafer W. With this operation, as shown in FIG. 10(B), the protection film formation solution 225 is brought into contact with the polished surface of the wafer W. By this contact, the protection film W1 is formed on the polished surface of the wafer W.

For performing the protection film formation step, when the support 32 is moved upward to separate the polished surface of the wafer W from the rough polishing cloth 223, the polished surface of the wafer W is exposed in the air. Since a dangling-bond defect is present on the polished surface, when the wafer W is delivered in the air to a polishing stage at a different unit (e.g., the first finish polishing unit 23) from the rough polishing unit 22, the water mark defect is formed on the surface of the wafer W due to contamination by particles floating in the air and/or a reaction with oxygen. The water mark defect formed at this stage turns out to be a micro concave defect after the wafer W is subjected to the epitaxial growth and is finally detected as a micro LPD.

Accordingly, in order to minimize the exposure in the air of the polished surface of the wafer W, it is preferable that the protection film formation step is performed on the rough polishing cloth 223, which is the same stage as the polishing stage where the first polishing step is performed.

When the protection film formation solution is brought into contact with the polished surface of the wafer W, the wafer W and the polishing stage may be rotated or halted. In order to form the protection film W1 by reliably applying the protection film formation solution to a position corresponding to the center of the wafer W, it is desirable that the protection film formation solution is brought into contact with the polished surface of the wafer W while the wafer W and the polishing stage (i.e., the rough polishing cloth 223) are rotated in opposite directions. When both of the wafer W and the polishing stage are rotated while the wafer W is pressed onto the rough polishing cloth 223, the polished surface of the wafer W after being subjected to the rough polishing is polished by an etching operation by an alkaline component in the protection film formation solution and by a removal operation of an etching residue by the rough polishing cloth 223. In other words, since the polishing of the polished surface of the wafer W proceeds in the absence of abrasive grains in the protection film formation step, process damage on the polished surface of the wafer W caused by abrasive grains in the first polishing step (i.e., the rough polishing) can be removed and a predetermined protection film W1 is formed on the polished surface of the wafer W.

Protection Film Formation Solution 225

The water-soluble polymer contained in the protection film formation solution 225 is preferably a polymer compound having a cellulose structure or a nonionic polymer compound. The polymer compound having a cellulose structure is exemplified by hydroxyethylcellulose. Examples of the nonionic polymer compound include polyvinyl alcohol, polyacrylamide, polyvinylpyrrolidone, polyethyleneglycol, polypropyleneglycol, and polyethylene oxide. The water-soluble polymer is preferably in a form of a linear micelle with a hydrophobic group at one end and a hydrophilic group at the other end.

The water-soluble polymer preferably has a concentration ranging from 10 ppm to 30 ppm. At less than 10 ppm, even when the protection film formation solution 225 is brought into contact with the polished surface of the wafer W, the protection film W1 enough for providing desired effects on the polished surface of the wafer W is possibly not formed. In this case, the water mark defect may be formed on the polished surface of the wafer W.

On the other hand, at more than 30 ppm, a thickness of the protection film W1 formed on the polished surface of the wafer W becomes too thick, so that the polishing time for removing the protection film W1 may be increased in the subsequent second polishing step.

The protection film formation solution 225 preferably contains the alkaline liquid as a primary agent.

Just after the rough polishing, the rough polishing liquid 224 is present in a space between the rough polishing cloth 223 and the polished surface of the wafer W. Accordingly, the protection film formation solution 225 is supplied to the space where the rough polishing liquid 224 remains. When the protection film formation solution 225 contains no alkaline component, a large difference in pH is generated between the rough polishing liquid 224 and the protection film formation solution 225. Due to such a large difference, the components present in the space between the rough polishing cloth 223 and the polished surface of the wafer W may agglomerate to each other. The agglomerated components may cause damage on the polished surface of the wafer W. Accordingly, pH of the protection film formation solution 225 is preferably adjusted by adding a slight amount of an alkaline component (e.g., amine). In this arrangement, the kind of the alkaline component is not particularly limited as long as pH of the protection film formation solution 225 falls within a range from 10 to 11.

As described above, in the protection film formation step, the protection film formation solution 225 preferably contains no abrasive grains since the process damage caused by abrasive grains in the first polishing step can be removed by proceeding the polishing of the polished surface of the wafer W in the absence of abrasive grains.

Protection Film W1

The protection film W1 is an organic film formed by attaching the hydrophobic group of the water-soluble polymer to the polished surface of the wafer W.

The protection film W1 preferably has a thickness ranging from 10 nm to 100 nm. At the thickness falling within the above range, even when the wafer W is delivered in the air from the rough polishing unit 22 to the first finish polishing unit 23, the polished surface can be prevented from contacting with the alkaline component caused by the rough polishing liquid 224 and oxygen in the air, so that the polished surface of the wafer W is not etched by these components.

By performing the protection film formation step as described above, the protection film W1 is formed on the polished surface of the wafer W. As shown in FIG. 10(C), since the protection film W1 is present on the polished surface of the wafer W, a typical generation of the water mark defect during the delivery of the silicon wafer in the air in the transition from the rough polishing to the finish polishing can be reduced.

After the protection film formation step is finished, the supply of the protection film formation solution 225 is stopped and the rotation of the polishing head 4 is stopped. The polishing head 4 is moved upward while holding the wafer W. Next, the support 32 is moved upward and subsequently rotated by 90 degrees to move the polishing head 4 holding the wafer W to a position above the first finish polishing unit 23.

Second Polishing Step

The second polishing step corresponds to the finish polishing step in the one-side polishing step and is performed in order to reduce a surface roughness.

The second polishing step in the exemplary embodiment is performed in two stages including the first finish polishing by the first finish polishing unit 23 and the second finish polishing by the second finish polishing unit 24.

Referring back to FIG. 8, the support 32 is lowered while the head rotary driving unit 33 rotates the polishing head 4. The finish polishing liquid is supplied onto the first finish polishing cloth 233. The wafer W held by the polishing head 4 is brought into contact with the polishing surface of the rotating first-finish-polishing cloth 233. With this operation, the finish polishing is applied to the wafer W while the wafer W is pressed onto the first finish polishing cloth 233. The first finish polishing cloth 233 may be a velour cloth or a suede cloth.

The finish polishing liquid contains abrasive grains. Specifically, the finish polishing liquid can contain a mixture of abrasive grains such as colloidal silica, diamond and alumina. An average diameter of each of the abrasive grains only needs to be selected within a range in which the abrasive grains do not agglomerate to each other so as not to generate defects caused by a processing such as microscratch. The average diameter desirably ranges from 10 nm to 50 nm.

As the finish polishing liquid, it is desirable to use an alkaline aqueous solution containing a main alkaline agent and having an adjusted pH ranging from 8 to 13. Examples of the alkaline aqueous solution include: an alkaline aqueous solution or an alkaline carbonate aqueous solution in which any one of a basic ammonium salt, a basic potassium salt, and a basic sodium salt is added as the alkaline agent; and an alkaline aqueous solution added with amine. Further, a water-soluble polymer is added to the finish polishing liquid. The water-soluble polymer used in the finish polishing liquid is desirably a polymer compound having a cellulose structure or a nonionic polymer compound. Specifically, the polymer compound having a cellulose structure is exemplified by hydroxyethylcellulose. Examples of the nonionic polymer compound include polyvinyl alcohol, polyacrylamide, polyvinylpyrrolidone, polyethyleneglycol, polypropyleneglycol, and polyethylene oxide.

The concentration of the water-soluble polymer in the protection film formation solution used in the protection film formation step is preferably lower than the concentration of the water-soluble polymer in the finish polishing liquid used in the second polishing step. When the concentration of the water-soluble polymer in the protection film formation solution is higher than the concentration of the water-soluble polymer in the finish polishing liquid, the amount of the water-soluble polymer derived from the protection film formation solution and brought to the second polishing step is increased to decrease the polishing rate below a predetermined value in the second polishing step, which may impair manufacturing of a haze surface.

After the first finish polishing by the first finish polishing unit 23 is finished, the polishing head 4 is stopped being rotated and moved upward while holding the wafer W. The support 32 is moved upward and subsequently rotated by 90 degrees to move the polishing head 4 holding the wafer W to a position above the second finish polishing unit 24.

The second finish polishing by the second finish polishing unit 24 is performed to provide a finer surface roughness than that in the first finish polishing. Since the second finish polishing is performed in the same manner as the first finish polishing except for the above treatment, the description of the second finish polishing will be omitted.

By performing the second finish polishing as described above, micro-roughness at a haze level is formed.

Finally, after the second finish polishing by the second finish polishing unit 24 is finished, the support 32 is moved upward and subsequently rotated by 90 degrees to move the polishing head 4 holding the wafer W to a position above the cleaning unit 21. The support 32 is lowered, whereby the wafer W sucked and held by the wafer chuck of the polishing head 4 is released to be returned on the cleaning unit 21.

Advantage(s) of Embodiment(s)

As described above, the following advantages are achievable by the above-described exemplary embodiment.

(1) In the protection film formation step subsequent to the first polishing step, the protection film formation solution 225 containing the water-soluble polymer is brought into contact with the polished surface of the wafer W tri form the protection film W1 on the polished surface.

Accordingly, since the protection film W1 prevents the polished surface from being exposed in the air, a reaction between the polished surface and oxygen in the air is inhibited. Moreover, the polished surface is free from being etched by the alkaline component remaining in the polishing liquid. Accordingly, in the one-side polishing step, generation of the water mark defect during the delivery of the silicon wafer in the air of the wafer W in the transition from the rough polishing to the finish polishing is reduced. Consequently, the micro concave defect caused by the water mark defect is reduced on the manufactured epitaxial silicon wafer.

(2) The water-soluble polymer of the protection film formation solution 225 supplied in the protection film formation step remains in the rough polishing cloth 223 used in the previous cycle. Accordingly, in the first polishing step in the next cycle, the rough polishing is performed with the rough polishing cloth 223 in which the water-soluble polymer remains. In this case, the water-soluble polymer deteriorates a removability of the native oxide film, so that the removal of the native oxide film is delayed at the periphery of the wafer as compared with the center of the wafer. Consequently, an edge roll-off amount of the wafer W at the next and subsequent cycles is reducible.

(3) The water-soluble polymer in the protection film formation solution 225 has the concentration ranging from 10 ppm to 30 ppm. Accordingly, the protection film W1 is formed on the polished surface of the wafer W to have a thickness to the extent that generation of the water mark defect can be inhibited. Moreover, as long as the concentration of the water-soluble polymer falls within the above concentration range, the amount of the water-soluble polymer remaining in the rough polishing cloth 223 is small enough not to impair the rough polishing. Accordingly, the polishing rate is not drastically decreased also in the rough polishing in the next cycle.

Other Embodiment(s)

It should be understood that the scope of the invention is not limited to the above exemplary embodiment but includes various improvements and modifications in design as long as such improvements and modifications are compatible with an object of the invention.

Specifically, although the protection film W1 is formed by bringing the protection film formation solution 225 into contact with the polished surface of the wafer W in the protection film formation step in the above exemplary embodiment, the wafer W may be polished while the protection-film-formation-solution supply unit supplies the protection film formation solution 225.

Moreover, a pure water rinse cleaning may be performed between the first polishing step and the protection film formation step or between the protection film formation step and the second polishing step. The rough polishing unit 22 of the polishing device 1 includes a pure water rinsing liquid supply unit. The pure water rinse cleaning is performed by appropriately supplying the rinsing liquid for rinsing the polished surface of the wafer W onto the polishing surface of the rough polishing cloth 223.

Further, although the second polishing step is performed in two stages including the first finish polishing by the first finish polishing unit 23 and the second finish polishing by the second finish polishing unit 24, the second polishing step may be performed in a single stage.

EXAMPLES

Next, the invention will be described in further detail below with reference to Examples. However, it should be understood that the scope of the invention is not limited by the Examples.

Example 1

First, a silicon wafer having a 300-mm diameter was prepared by sequentially performing the steps of slicing, chamfering, lapping, etching, double-sided polishing and washing. Next, using the polishing device 1 shown in FIG. 8, the washed silicon wafer was subjected to a one-side polishing step below.

In the one-side polishing step in Example 1, the first polishing step (rough polishing), the protection film formation step, and the second polishing step (finish polishing) were sequentially performed. The used rough polishing liquid and protection film formation solution are shown in Table 1.

Example 2

Treatments in steps in Example 2 were performed in the same conditions as in Example 1 except that the alkaline agent of the protection film formation solution used in the protection film formation step was changed to amine and PEG (polyethyleneglycol) was added as the water-soluble polymer in addition to HEC (hydroxyethyl cellulose) as shown in Table 1.

Comparative 1

Treatments in steps in Comparative 1 were performed in the same conditions as in Example 1 except that the protection film formation step performed in Example 1 was not performed and the rinse cleaning was performed after the first polishing steps.

TABLE 1

|  | Rough Polishing | Protection Film Formation Solution | | |
|---|---|---|---|---|
|  | Liquid | Example 1 | Example 2 | Comparative 1 |
| Alkaline agent | KOH | ammonia | amine | — |
| Polymer (HEC) [ppm] | 0 | 10 | 10 | — |
| Polymer (PEG) [ppm] | 0 | 0 | 20 | — |

A silicon epitaxial film having a 4-μm thickness was formed by a CVD method on a surface of each of the silicon wafers subjected to the one-side polishing step in the above conditions, thereby manufacturing an epitaxial silicon wafer.

Evaluation items of the wafer were the number of the LPD of the epitaxial silicon wafer, observation of an LPD map of the epitaxial silicon wafer, and surface roughness of the silicon wafer before being subjected to the epitaxial growth.

The number of the LPD and the observation of the LPD map of the epitaxial silicon wafer were obtained by observing the surface of the wafer in DIC mode using a surface defect inspection device (Surfscan SP-2: manufactured by KLA-Tencor Corporation).

The surface roughness Ra of the silicon wafer was measured by a surface roughness measurement device (manufactured by Chapman).

FIG. 11 shows the number of the micro LPD generated on the surface of the epitaxial silicon wafer in each of Example 1, Example 2 and Comparative 1. FIG. 12 shows the surface roughness Ra of the silicon wafer in each of Example 1, Example 2 and Comparative 1. FIGS. 13 to 15 show the maps of the LPD generated on the surface of the epitaxial silicon wafers in Example 1, Example 2 and Comparative 1, respectively.

As apparently understood from FIGS. 11 and 12, the number of the micro LPD and the surface roughness Ra both tend to be decreased in Examples 1 and 2 where the protection film was formed as compared with Comparative 1 where the protection film was not formed after the first polishing step.

In comparison between Example 1 and Example 2, the number of the micro LPD and the surface roughness Ra are both decreased in Example 2, Accordingly, it is inferred that use of the protection film formation solution having a high polymer concentration leads to formation of a protection film having a higher protection capability.

It is confirmed from FIGS. 13 to 15 that the number of the micro LPD in each of Examples 1 and 2 is lower than that in Comparative 1 as a result of the substantial observation of the LPD generated on the surface of the epitaxial silicon wafer. It is inferred that this is caused by a decrease in the micro concave defect derived from the water mark defect.

Moreover, in comparison between Example 1 and Example 2, the number of the LPD is small in Example 2. Accordingly, it is inferred that the water mark defect has been sufficiently inhibited.

Since the protection film formation solution used in Example 2 contains PEG as the water-soluble polymer, it is inferred from the results that the protection film formed of PEG exhibits a high passivation effect and a high etching stopper effect.

Example 3

Silicon wafers were manufactured in the same manner as in Example 2 except that the epitaxial growth treatment was not performed, the protection film formation solution only containing PEG as the water-soluble polymer was used in the protection film formation step, and the PEG concentration in the protection film formation solution was adjusted. The polymer concentration was adjusted to 0 ppm, 5 ppm, 10 ppm, 20 ppm, 30 ppm, 50 ppm and 100 ppm.

With respect to the obtained silicon wafers, the number of the generated water mark, the polishing rate, and an edge profile and a surface profile of the wafer near the edge (edge roll-off: ERO) were measured.

The results are shown in FIG. 16. It should be noted that an index value shown as the ordinate axis in FIG. 16 is a relative value to the result when the solution with 0 ppm of the PEG concentration, in other words, the solution containing no PEG was used.

It is confirmed from FIG. 16 that, since the number of the generated water mark is decreased as the polymer concentration of the protection film formation solution is increased, the protection film formation solution having a higher polymer concentration exhibits a higher protection effect by the protection film to be able to prevent generation of the water mark.

On the other hand, the results reveal that the polishing rate is decreased as the polymer concentration of the protection film formation solution is increased. It is inferred that this is because the polymer remains in the polishing cloth when the polymer concentration is high, resulting in a decrease in the polishing rate in the rough polishing at the next cycle.

The results reveal that the most suitable range of the polymer concentration of the protection film formation solution is from 10 ppm to 30 ppm, where the number of the generated water mark is small and the polishing rate is high.

Moreover, the results show that the edge roll-off is decreased as the polymer concentration of the protection film formation solution is increased. It is inferred that this is because the polymer remaining in the polishing cloth acts on the silicon wafer in the rough polishing at the next cycle to delay the removal of the native oxide film, thereby inhibiting the edge roll-off. It was confirmed that the edge roll-off was inhibited also in the most suitable range of the polymer concentration and the edge roll-off was further inhibited by performing the protection film formation step subsequent to the first polishing step to form the protection film on the polished surface.

The invention claimed is:

1. A method of polishing a silicon wafer, comprising:
   a first polishing step of polishing a surface of the silicon wafer while supplying to a polishing cloth a first polishing liquid comprising: a primary agent in a form of an alkaline aqueous solution; and abrasive grains, the first polishing liquid comprising no water-soluble polymer;
   subsequent to the first polishing step, a protection film formation step of supplying a protection film formation solution comprising a water-soluble polymer to the polishing cloth after being used in the first polishing step, and bringing the protection film formation solution into contact with the polished surface of the silicon wafer subjected to the first polishing step to form a protection film on the polished surface; and
   a second polishing step of polishing the surface of the silicon wafer where the protection film is formed while supplying, to a polishing cloth different from the polishing cloth used in the first polishing step, a second polishing liquid comprising: a primary agent in a form of an alkaline aqueous solution; abrasive grains; and a water-soluble polymer.

2. The method of polishing the silicon wafer according to claim 1, wherein
   the water-soluble polymer in the protection film formation solution has a concentration ranging from 10 ppm to 30 ppm.

3. The method of polishing the silicon wafer according to claim 1, wherein
   the water-soluble polymer used in the protection film formation solution is a polymer compound having a cellulose structure or a nonionic polymer compound.

4. The method of polishing the silicon wafer according to claim 2, wherein
   the water-soluble polymer used in the protection film formation solution is a polymer compound having a cellulose structure or a nonionic polymer compound.

* * * * *